United States Patent [19]
McElroy

[11] 4,184,207
[45] Jan. 15, 1980

[54] HIGH DENSITY FLOATING GATE ELECTRICALLY PROGRAMMABLE ROM

[75] Inventor: David J. McElroy, Houston, Tex.

[73] Assignee: Texas Instruments Incorporated, Dallas, Tex.

[21] Appl. No.: 923,876

[22] Filed: Jul. 12, 1978

Related U.S. Application Data

[62] Division of Ser. No. 762,613, Jan. 27, 1978.

[51] Int. Cl.² .............................................. G11C 11/40
[52] U.S. Cl. ...................................... 365/185; 357/23; 307/238; 365/104; 365/182
[58] Field of Search .................. 357/23; 365/104, 182, 365/184, 185; 307/238, 279

[56] References Cited
U.S. PATENT DOCUMENTS

| | | | |
|---|---|---|---|
| 3,760,378 | 9/1973 | Burns | 365/174 |
| 3,836,992 | 9/1974 | Abbas et al. | 357/23 |
| 3,984,822 | 10/1971 | Simko et al. | 365/182 |
| 4,112,509 | 9/1978 | Wall | 365/185 |
| 4,122,544 | 10/1978 | McElroy | 365/185 |

*Primary Examiner*—Terrell W. Fears
*Attorney, Agent, or Firm*—John G. Graham

[57] ABSTRACT

An N-channel double level poly, MOS read only memory or ROM array is electrically programmable by floating gates which are interposed between the gate oxide and control gates formed by polycrystalline silicon row address lines. The cells may be electrically programmed by applying selected voltages to the source, drain, control gate and substrate. A very dense array is obtained by a simplified manufacturing process which is generally compatible with standard N-channel silicon gate technology. Parallel strips of gate oxide, polycrystalline silicon, and nitride oxidation mask are applied, field oxide is grown, then a perpendicular pattern of strips is etched, removing field oxide as well as parts of the original strips, providing a diffusion mask. The second level poly is then applied as strips overlying the original strips.

10 Claims, 6 Drawing Figures

HIGH DENSITY FLOATING GATE ELECTRICALLY PROGRAMMABLE ROM

This is a division, of application Ser. No. 762,613, filed Jan. 27, 1978.

BACKGROUND OF THE INVENTION

This invention relates to semiconductor memory devices and more particularly to an MOS ROM which is electrically programmable.

Semiconductor memory devices which are nonvolatile have great utility in that the information stored is not lost when the power supply is removed. The most common example of a nonvolatile memory is the MOS ROM wherein the stored information is permanently fixed upon manufacture by the gate level mask or moat mask as set forth in U.S. Pat. No. 3,541,543, assigned to Texas Instruments. Most calculators and microprocessor systems employ ROM's of this type to store a program consisting of a large number of instruction words. However, it would be perferable to be able to program the ROM devices after manufacture, so that all devices would be made the same with no unique masks required. Various electrically programmable ROM devices have been developed such as that shown in U.S. Pat. No. 3,984,822 which employs a floating gate in a double level polysilicon MOS ROM; the floating gate is charged by injection of electrons from the channel, and stays charged for years. Other devices of this type have employed charge storage on a nitride-oxide interface. Electrically alterable ROM's have been developed as set forth in U.S. Pat. Nos. 3,881,180, issued Apr. 29, 1975, and 3,882,469, issued May 6, 1975, as well as application Ser. No. 644,982, filed Dec. 29, 1975, all by W. M. Gosney and assigned to Texas Instruments; the Gosney devices are floating gate cells with dual injection (both holes and electrons) so that the gates may be charged or discharged. Other electrically programmable and electrically alterable ROM's are disclosed in copending application Ser. Nos. 754,144, 754,206, 754,207, and 754,208, all filed Dec. 27, 1976 by Lawrence S. Wall or David J. McElroy and assigned to Texas Instruments. However, the prior cells have exhibited some undersirable characteristic such as large cell size, process incompatible with standard techniques, high voltages needed for programming, etc.

It is therefore the principal object of the invention to provide an improved electrically programmable semiconductor memory cell. Another object is to provide an electrically programmable cell which is of small cell size when formed in a semiconductor integrated circuit. A further object is to provde a process for making dense arrays of electrically programmable memory cells compatible with N-channel silicon gate technology.

SUMMARY OF THE INVENTION

In accordance with an embodiment of the invention, a floating gate MOS programmable ROM cell is provided which is made by an N-channel, silicon-gate, self-aligned, double level poly process which is generally comparable with standard processing techniques. The floating gate is formed by the first level polysilicon which is isolated from the second level poly by an insulator. The cells are electrically programmed by applying proper voltages to the sources, drains, and gates. A dense array is obtained by a process wherein parallel strips of gate oxide, first level poly, and silicon nitride are formed by depositing these layers and patterning, then field oxide is grown using the nitride as a mask. A pattern of parallel strips, perpendicular to the first strips, is etched to remove the field oxide and parts of the original strips to produce a diffusion mask. The second level poly is applied after the diffusion to create control gates and row lines.

THE DRAWINGS

The novel features believed characteristic of the invention are set forth in the appended claims. The invention itself, however as well as other features and advantages thereof, may best be understood by reference to the following detailed description of illustrative embodiments, when read in conjunction with the accompanying drawings, wherein:

DETAILED DESCRIPTION OF SPECIFIC EMBODIMENT

Figure 1:
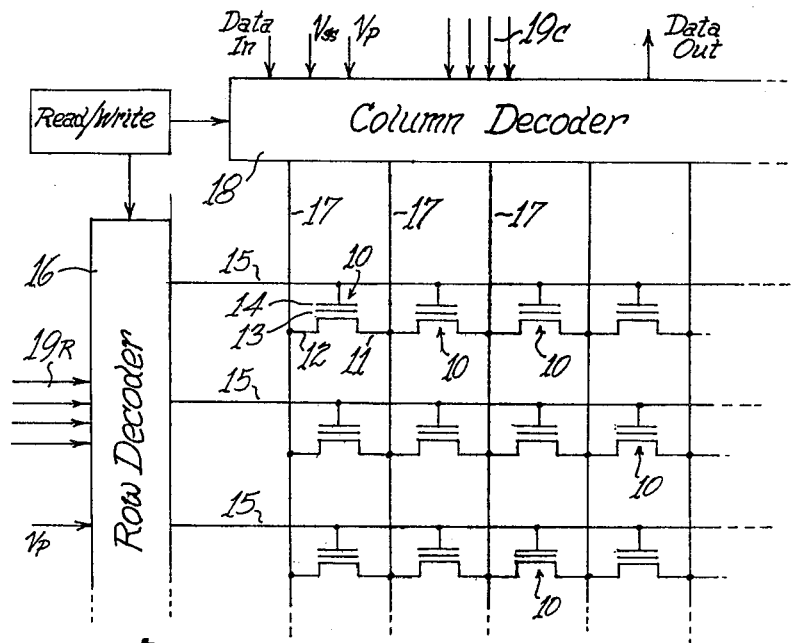
FIG. 1 is an electrical schematic diagram of an array of memory cells according to the invention.

Referring now to FIG. 1, an array of memory cells is shown according to the invention. Each cell is a floating gate transistor 10 having a source 11, a drain 12, a floating gate 13 and a control gate 14. All of the gates 14 in a row of cells are connected to a row address line 15, and all of the row address lines 15 are connected to a row decoder 16. All of the source and drain electrodes 11 or 12 in a column of cells are connected to a column line 17, and the source and drain column lines 17 are connected at each end to a column decoder 18. In a write or program mode, the column decoder functions to apply either a high voltage (about +25 v.) or a low voltage (ground of Vss, or Vbb, depending upon process) selectively to each source and drain column line 17, in response to a column address on lines 19c and a "0" or "1" data input. For write or program operations, the row decoder 16 functions to apply a high voltage Vp or a low voltage Vss or ground to each of the row lines 15 in response to a row address on lines 19R. For read, the column decoder 18 grounds the line 17 to the right of the selected cell and connects a static load to the column line 17 on the left, using a decode arrangement as in FIG. 14 of U.S. Pat. No. 3,988,604, issued Oct. 26, 1976 to J. H. Raymond, assigned to Texas Instruments; the row decoder 16 applies a logic "1" to Vdd voltage to the selected row line 15 and applies a logic "0" or Vss to all other row lines 15.

Figure 2:
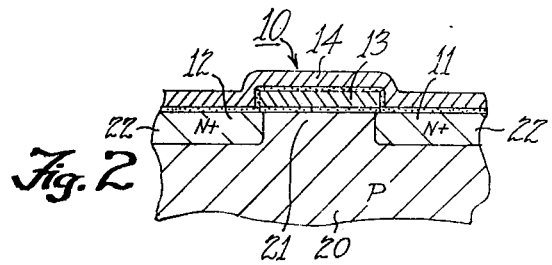
FIG. 2 is an enlarged sectional view of one of the memory cells in the array of FIG. 1.

The structure of one of the cells is seen in a greatly enlarged sectional view in FIG. 2. The cell is formed in a semiconductor substrate 20 which is P-type silicon for the N-channel silicon gate MOS transistors herein described. The transistor 10 of the cell is created by a channel region 21 between N+ type regions 22 which are the source 11 and drain 12. The channel region 21 lies beneath the floating gate 13 which is composed of phosphorus-doped polycrystalline silicon. The floating gate 13 is insulated from the underlying channel region 21 by a gate oxide layer 23 which according to the invention is the original thermally-grown silicon oxide of a thickness of perhaps 700 to 1200 Å, as will be described. The control gate 14 is also composed of phosphorus-doped polycrystalline silicon extending beyond the edges of the floating gate 13 as the row line 15. The control gate 14 is isolated from the floating gate by a thermal oxide layer 24 which may be of selected thickness. Generally, according to copending application Ser. No. 754,144 filed Dec. 27, 1976 by L. S. Wall, assigned to Texas Instruments, the thickness of the oxide layer 24 may be selected, depending upon a number of factors such as process variations, desired operating voltages and conditions, and the like, so that charge escapes from the floating gate 13 when the electric field across the oxide layer 24 is high so the device may be electrically deprogrammed, whereas ordinarily this leakage is an undesirable condition; otherwise the oxide layer 24 is made thicker than the gate oxide 23, for example about 2000 Å. The cell is programmed by holding the source 11 at high voltage, Vp about +25 v. and the drain 12 at Vss while the control gate 14 is at Vp, whereupon the level of current through the channel 21 is such that electrons are injected through the oxide 23 and charge the floating gate 13. Once charged, the floating gate stays in this condition indefinitely, and subsequently the apparent threshold voltage of the transistor is greatly increased, from perhaps +3 to +11 volts. The array is deprogrammed by exposing to ultraviolet light.

Figure 3:
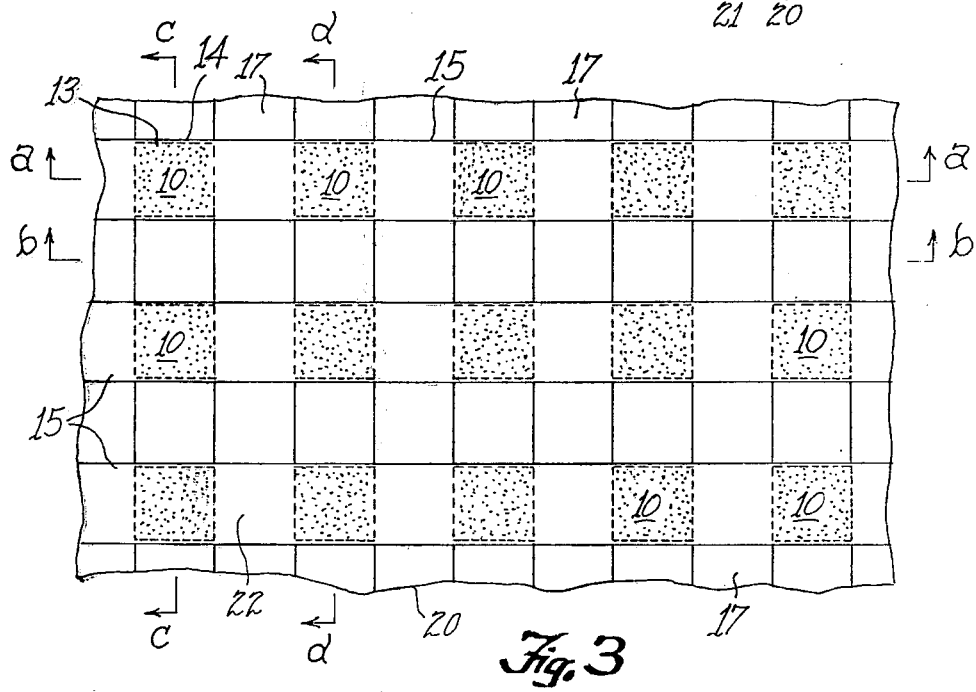
FIG. 3 is a plan view of a part of a semiconductor integrated circuit chip containing an array of the cells of FIGS. 1 and 2.
Figure 4:
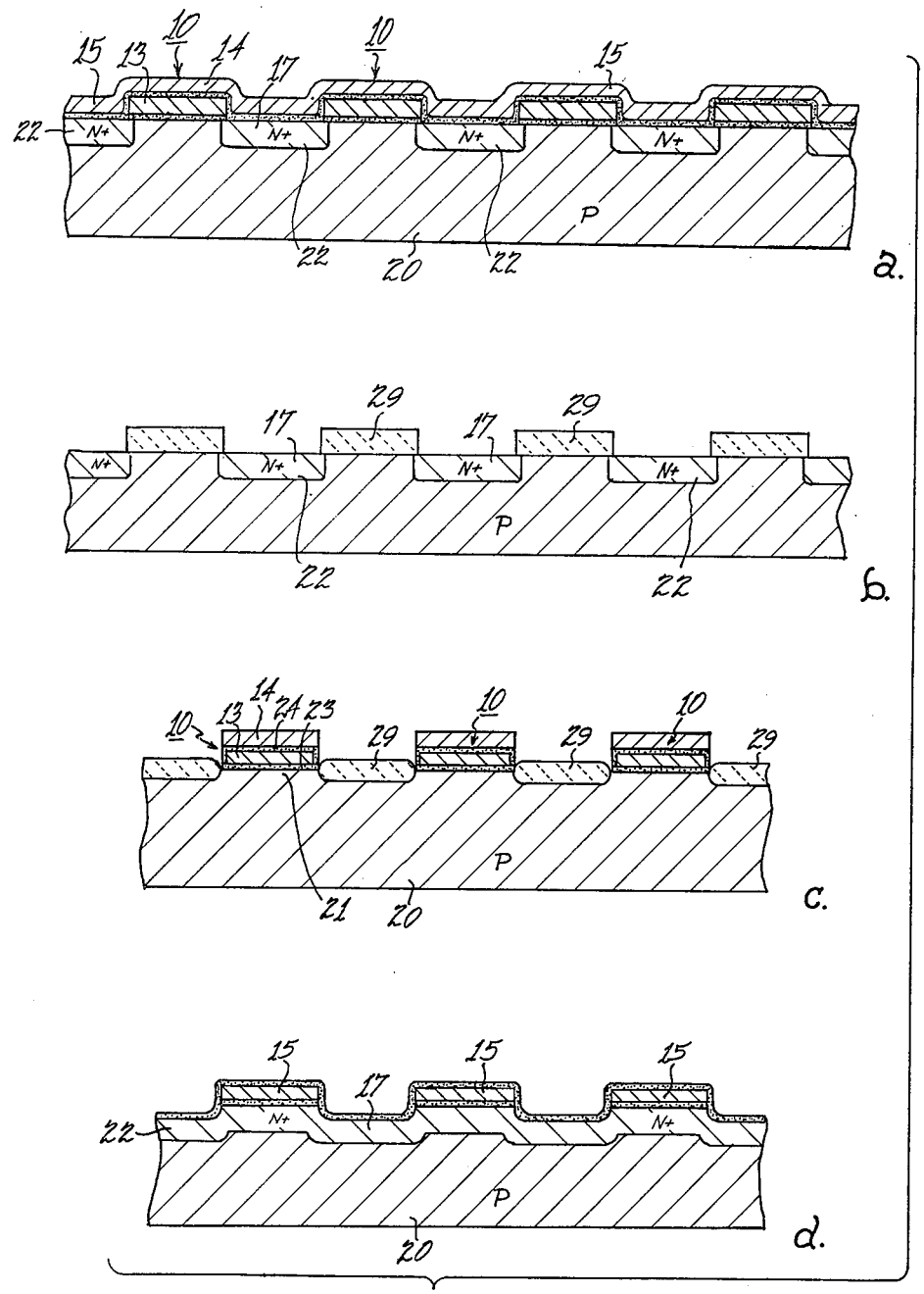
FIGS. 4a-4d are elevation views in section of the array of FIG. 3, taken along the lines a—a, b—b, c—c, and d—d respectively, in FIG. 3.
Figures 5, 6:
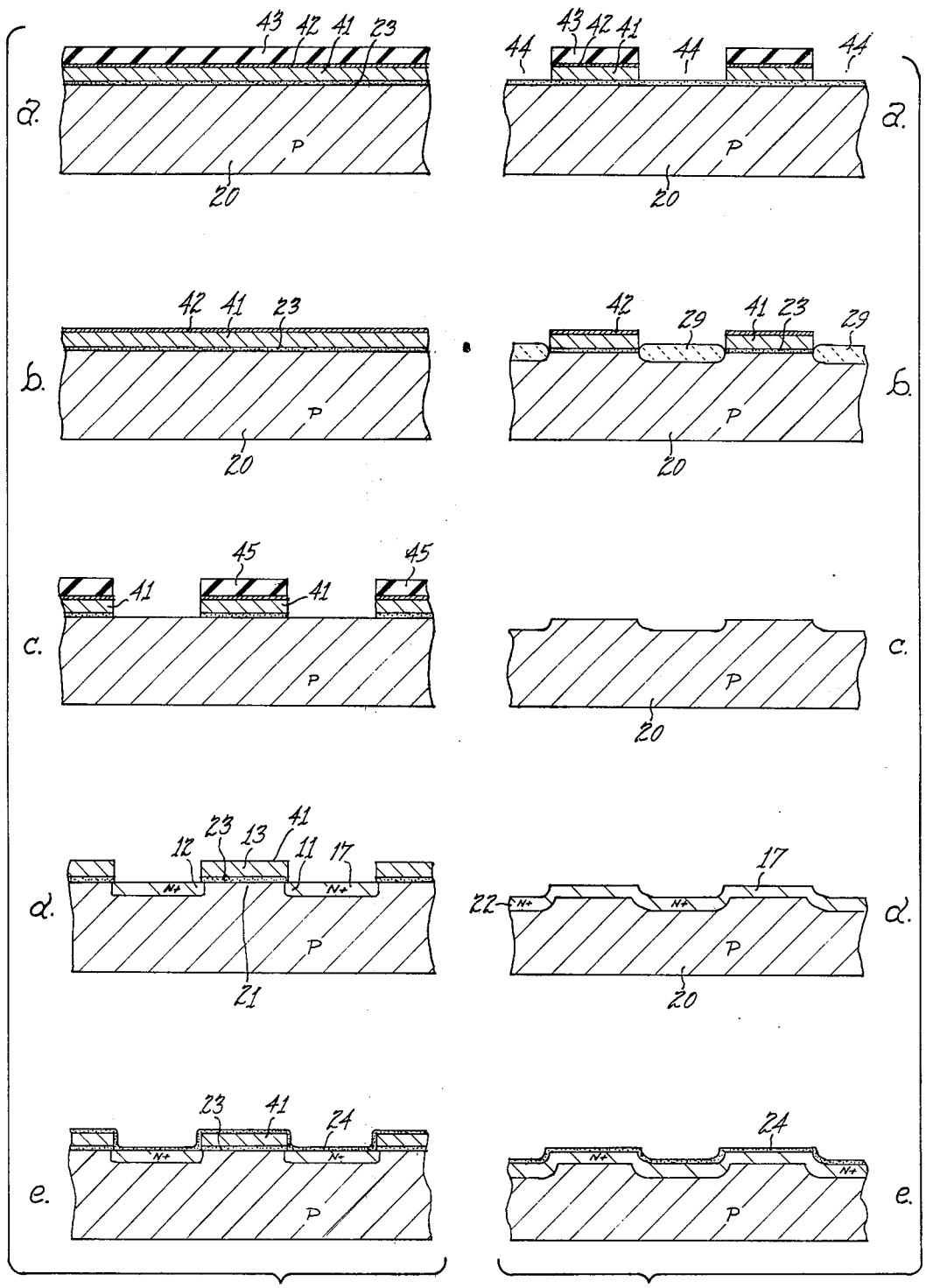
FIGS. 5a-5e are sectional views corresponding to FIG. 2 or 4a showing a cell according to the invention at various stages of manufacture.
FIGS. 6a-6e are sectional views corresponding to FIG. 4d showing the array at successive stages of manufacture.

Referring now to FIG. 3, a part of a cell array according to the invention is illustrated. FIGS. 4a to 4d are sectional views of the device of FIG. 3, as is FIG. 2, showing details of construction. The area shown in FIG. 3 is about 0.6 mils by 1.0 mils in size; the entire cell array may contain for example, 65536 cells ($2^{\neq}$) or 131072 cells ($2^{17}$), or other power of two. The twelve transistors 10 for the cells shown are created in three parallel elongated moats forming the rows of cells which have thick field oxide 29 on each side. N+ diffused regions 22 in the moats form interrconnections between the cells and the sources and drains of the transistors, creating the rows of cells as well as the column lines 17. Elongated parallel strips of polycrystalline silicon form the address lines 15 and the control gates 14 of the transistors. The floating gates 13 are buried beneath the strips 15. The simplified structure and manufacturing technique of the invention allows the sources, drains, rows and column lines to be formed and interconnected in one diffusion masking operation with a very dense layout.

Turning now to FIGS. 4a–4e and 5a–5e, a process for manufacturing the devices described above will be explained. Note that FIGS. 4a–4e correspond to the sectional view of FIG. 2 or 4a in the finished device, that is to line 2—2 in FIG. 3, while FIGS. 5a–5e correspond to the sectional view of FIG. 4d, that is to the line d—d in FIG. 3.

This is similar to an N-channel, silicon-gate, double level poly process for making MOS integrated circuit devices except that the first level poly is deposited at the beginning. The starting material is a slice of P-type monocrystalline silicon, perhaps 3 inches in diameter and 30 mils thick, cut on the <100> plane, of P-type conductivity doped with boron in growing to a resistivity of about 6 to 8 ohm-cm. In the FIGS. 3–5, the wafer or body 20 represents a very small part of the slice, chosen as representative sample cross sections. First, after appropriate cleaning, the slice is oxidized by exposing to oxygen in a furnace at an elevated temperature of perhaps 1000° C. to produce an oxide layer 23 of a thickness of about 1000 Å; in contrast to prior methods, this layer 23 remains in the finished device as the gate oxide. Next a layer 47 of polycrystalline silicon is deposited over the entire slice in a reactor using standard techniques, for example by decomposition of silane in hydrogen at about 930° C. to a thickness of about one-half micron, producing the polysilicon which will ultimately form the floating gates 13. The layer of poly is subjected to a phosphorus deposition and diffusion to render it highly conductive. This diffusion does not penetrate the substrate 20 (except perhaps at poly to silicon contact areas on other parts of the slice, not shown). Then a layer 42 of silicon nitride $Si_3N_4$ is formed by exposing to an atmosphere of silane and ammonia in an rf reactor. This nitride layer 42 is grown to a thickness of about 1000 Å. Next, the three-layer sandwich is patterned in a plurality of parallel strips corresponding to the rows. To this end a coating 43 of photoresist is applied to the entire top surface, then exposed to ultraviolet light through a mask which defines the desired pattern, and developed. This leaves areas 44 where nitride is to be etched away; these are the areas where field oxide 29 is to be grown. The slice is subjected to an etch sequence, which removes the part of the nitride layer 42 not covered by the photoresist 43, as well as the exposed poly 41 and oxide 23, but does not react with the photoresist 43.

The slice might now be subjected to an ion implant step preferably using another oversized moat mask, whereby boron atoms are implanted in the areas of silicon not covered by photoresist which masks the implant. Boron is an impurity which produces p-type conductivity, so a more heavily doped P+ region will be produced in the surface. The boron implant would be at a dosage of about $4 \times 10^{13}/cm^2$ at 100 KeV. After the implant, the photoresist layer is removed. These implanted regions, not shown, would ultimately produce the P+ channel stop regions. Because of the oversized moat mask, the channel stop regions do not touch the N+ regions or channels, so breakdown problems are avoided.

The following step in the process is formation of field oxide, which is done by subjecting the slices to steam or an oxidizing atmosphere at about 900° C. for perhaps 10 hours. As seen in FIG. 6b, this causes a thick field oxide region or layer 29 to be grown, and this region extends into the silicon surface because silicon is consumed as it oxidizes. The nitride layer 42 masks oxidation beneath it. The thickness of this layer 28 may be thinner than in standard processing, perhaps about 4000 to about 8000 Å, half of which is above the original surface and half below. The channel stop implant, if performed, will be partly consumed, but will also diffuse further into the silicon ahead of the oxidation front.

Although not reflected in the figures, ion implant steps may be performed to create the desired threshold or operating parameters in transistors in the integrated circuit, either in the cell array or in the peripheral circuits such as decoders, output buffers, input latches and buffers, clock generators and the like. First, boron may be implanted at 50 KeV to a dosage of about $2.5 \times 10^{11}$ atoms/cm$^2$ for the purpose of adjusting the threshold voltage of thin oxide enhancement mode transistors so that substrate bias voltage will not be needed. Then, a photoresist layer may be applied and patterned to expose the channel areas of depletion load transistors in peripheral circuitry. These areas are then subjected to a phosphorus implant at 150 KeV with a dosage of about $1 \times 10^{12}$/cm$^2$. This phosphorus implant is selected to produce a compromise of high speed and low power for devices in the peripheral circuits.

Referring to FIG. 6c, the nitride 42, the polysilicon coating 41 and the underlying gate oxide layer 23 are next patterned in a plurality of parallel strips normal to the rows 15 to create the columns. This is done by applying a layer 45 of photoresist, exposing to ultraviolet light through a mask prepared for this purpose, developing, then etching with the remaining photoresist masking strips on the face of the wafer. The resulting structure is seen in FIGS. 5c and 6c, where parts of the remaining polysilicon layer 41 provide what will be the floating gates 13 of the transistors 10; the field oxide 29 is also removed in strips not covered by the photoresist layer 45, where the N+ diffusion will create the column lines 17.

Referring to FIGS. 5d and 6d, using the remain field oxide 29 as well as the polysilicon 41 and its underlying thin oxide 23 as a diffusion mask, the slice is now subjected to an N+ diffusion, whereby phosphorus is deposited and then diffused into the silicon slice 20 to produce the column lines 17, the N+ source and drain regions 11 and 12 as well as the regions 22 in the moats. The depth of diffusion is about 8000 Å. The N+ diffused regions function as conductors which connect the various regions together, and also function as the source or drain regions. The nitride 43 is removed and the exposed silicon surfaces are oxidized after the diffusion, providing an oxide coating 24 over the poly 41 and the silicon surface of FIG. 6e. The layer 24 of silicon dioxide is grown on the silicon and polysilicon, producing a coating on all exposed surfaces of the poly, including tops and sides. The layer 24 is grown at about 900° C. in oxygen for about one hour, producing approximately 2000 Å thickness and consuming part of the polysilicon.

The second level polycrystalline silicon is next deposited over the entire top surface of the slice over the oxide layer 24, using a reaction as above, then subjected to phosphorus diffusion to render it conductive, providing the control gates 14 and row lines or strips 15. The second level poly is patterned using photoresist to define the strips 15, producing the structure of FIGS. 2-5.

While this invention has been described with reference to an illustrative embodiment, this description is not intended to be construed in a limiting sense. Various modifications of the illustrative embodiment, as well as other embodiments of the invention, will be apparent to persons skilled in the art upon reference to this description. It is, therefore, contemplated that the appended claims will cover any such modifications or embodiments as fall within the true scope of the invention.

What is claimed is:

1. An electrically programmable, nonvolatile, floating gate, semiconductor memory array comprising: a plurality of MOS transistor devices each having a source, a drain, a floating gate, and a control gate, the floating gate being isolated from the channel between source and drain by thin oxide and the control gate being isolated from the floating gate by thin oxide, the transistor devices being arranged in an array of rows and columns, with the rows being separated by thick field oxide; means connecting the control gates of all devices in each row together to provide row lines; means including elongated parallel heavily-doped semiconductor regions forming the source and drain regions of the transistor devices connecting the sources and drains of all adjacent devices together to provide column lines; the heavily-doped regions formed with the thick field oxide to provide a diffusion mask; means for programming the array including means for selecting one of the row lines and applying a high voltage to it while applying a low voltage or reference potential to the remaining row lines, and means for selecting one pair of adjacent column lines and applying current through this pair while applying no current through all of the other pairs of column lines.

2. A memory array according to claim 1 wherein the transistor devices are N-channel and the floating gate and control gate are polycrystalline silicon.

3. A memory array according to claim 2 wherein means are provided for reading data from the array by applying an intermediate voltage to a selected one of the row lines, grounding one end of a selected one of the column lines, and applying a load device to the other end of the selected column line.

4. A memory array according to claim 1 wherein the sources, drains and channels of all transistor devices in each row are formed in one continuous elongated semiconductor region having heavily doped regions forming the sources and drains alternating with lightly doped regions forming the channels.

5. A memory array according to claim 4 wherein the row lines are elongated strips of polycrystalline silicon overlying the lightly doped regions.

6. An electrically programmable, nonvolatile, floating gate, semiconductor memory comprising: an array of MOS transistors arranged in rows and columns, each transistor having a source, a drain, a floating gate, and a control gate; each transistor having a thin insulating layer separating the floating gate and the control gate and a thin gate insulator separating the floating gate from a channel region between the source and drain; means connecting the drain of each transistor in a row to the source of an adjacent transistor in the row so that each row is a source-to-drain series-connected plurality of transistors; thick field oxide separating the rows from one another; means including elongated heavily-doped semiconductor regions perpendicular to the rows connecting source and drains of adjacent transistors into column lines; means for selectively applying high voltage to the control gates of a selected row while applying a low voltage or reference potential to other rows and applying current to a selected pair of adjacent columns to program the cell by charging the floating gate via electrons traversing the gate insulator.

7. A memory cell according to claim 6 wherein the rows are conductive material defining the control gates of a plurality of transistors.

8. A memory cell according to claim 7 wherein the MOS transistors are N-channel and the floating gates and control gates are polycrystalline silicon.

9. A memory cell according to claim 8 wherein the selected column has one end grounded and the other end connected through a load to a voltage supply.

10. A memory cell according to claim 9 wherein the intermediate voltage is at least threshold voltage and the high voltage is many times greater than threshold voltage.

* * * * *